US008223995B1

(12) United States Patent
Esposito

(10) Patent No.: US 8,223,995 B1
(45) Date of Patent: Jul. 17, 2012

(54) HEXAPHONIC GUITAR AMPLIFIER AND HEXAPHONIC SPEAKER CABINET

(76) Inventor: Joseph Esposito, East Haven, CT (US)

( * ) Notice: Subject to any disclaimer, the term of this patent is extended or adjusted under 35 U.S.C. 154(b) by 437 days.

(21) Appl. No.: 12/313,451

(22) Filed: Nov. 20, 2008

Related U.S. Application Data

(60) Provisional application No. 61/004,087, filed on Nov. 24, 2007.

(51) Int. Cl.
*H03F 99/00* (2009.01)

(52) U.S. Cl. ........................................ 381/120; 381/345

(58) Field of Classification Search .................. 381/120, 381/345

See application file for complete search history.

(56) References Cited

U.S. PATENT DOCUMENTS

| | | | | |
|---|---|---|---|---|
| 5,591,931 | A * | 1/1997 | Dame | 84/726 |
| 2004/0103776 | A1* | 6/2004 | Juszkiewicz et al. | 84/742 |
| 2008/0199033 | A1* | 8/2008 | Decanio | 381/349 |

FOREIGN PATENT DOCUMENTS

JP 11155182 A * 6/1999

* cited by examiner

*Primary Examiner* — Steven J Fulk

(57) ABSTRACT

A six channel guitar amplifier and speaker cabinet for producing orchestral guitar sounds and of the type having a hexagon shaped cabinet which will house six speakers (14) which will mount to six floating baffle boards (14*a*) which communicate at the six points of the hexagon cabinet and will vibrate independently. In addition a guitar with a hexaphonic pickup (16) will be received by a six way splitter box (18) through a seven pin cable (18*b*) and will feed the hexaphonic pickup signal into a six channel preamp (10*a*) to boost the weak signal inherent in hex pickups. The six channel hex preamp will feed into the six separate guitar amps (12) with six conventional patch cords (not shown). The six separate guitar amps outputs (12*a*) will be connected to the six speakers through conventional speaker cables facilitating independent amplification for each guitar string, resulting in hexaphonic guitar sound.

1 Claim, 3 Drawing Sheets

HEXAPHONIC GUITAR AMPLIFIER AND HEXAPHONIC SPEAKER CABINET

CROSS REFERENCE TO RELATED APPLICATIONS

This application claims the benefit of provisional patent application Ser. No. 61/004,087 filed 2007 Nov. 24 by the present inventor.

FEDERALLY SPONSORED RESEARCH

Not Applicable.

SEQUENCE LISTING OR PROGRAM

Not Applicable

BACKGROUND

1. Field of Invention

This invention relates to hexaphonic amplification and sound reinforcement, specifically, to guitar amplification.

2. Description of Prior Art

Guitar amplifiers are designed to produce over-driven, distorted tones that give power and sustain to the sound of the guitar. For single note leads and harmonically related intervals, these original guitar amplifiers are sufficient. Although, many chord types simply do not sound audible through a distorted signal, due to the minimal note separations between each string. This also affects the clarity of each string within a chord. Individual notes within a chord are muffled and often not heard. This severely limits the type of music that can be played with distortion.

The creation of hexaphonic pickups and hexaphonic fuzz circuits built into guitar synthesizers, addresses the problem with clarity and note separation when playing chords through a distorted signal.

However, guitar synthesizers never became popular, as they alter the natural sound nuances and dynamics of the guitar. Virtually all guitar amplifiers are incapable of producing orchestral sounds with a distorted signal, and all guitar synthesizers, at best, only produce imitational orchestral sounds that aren't realistic or guitar like.

OBJECTS AND ADVANTAGES

Accordingly, besides the objects and advantages of the hexaphonic guitar amplifier and hexaphonic speaker cabinet described in my above patent, several objects and advantages of the present invention are:

(a) to provide orchestral guitar sounds which are not possible with conventional guitar amplifiers;
(b) to provide more note separation and more clarity between each guitar string;
(c) to provide better string definition;
(d) to provide better dispersion of sound;
(e) to provide a sense of string travel;
(f) to provide an animated sound quality;
(g) to provide a six dimensional guitar sound;

Further objects and advantages include: acoustic; real time; string travel around a hexagon speaker cabinet, which creates an animated sound reminiscent of many popular electronic guitar effects such as chorus, twelve-string and Leslie, this obviates the need for electronics, since the acoustic, real time version of the same effect is more natural and audible.

SUMMARY

In accordance with the present invention, an amplifying circuit comprises six channels of amplification, routed to six different speakers within a hexagon shaped cabinet, allowing for independent amplification of each guitar string, resulting in hexaphonic guitar sound.

DRAWINGS

DRAWING FIGURES

In the drawings, closely related figures have the same number but different alphabetical suffixes.

REFERENCE NUMERALS IN DRAWINGS

| | |
|---|---|
| 10a | six channel preamp inputs |
| 10b | six channel preamp outputs |
| 12 | six guitar amp inputs |
| 12a | six guitar amp outputs |
| 14 | hexagon cabinet with six speakers |
| 14a | six floating baffle boards |
| 16 | guitar with hexaphonic pickup |
| 18 | six way splitter box |
| 18b | seven pin cable |
| 20 | seven cord power strip |

DETAILED DESCRIPTION

Description

Figure 1:
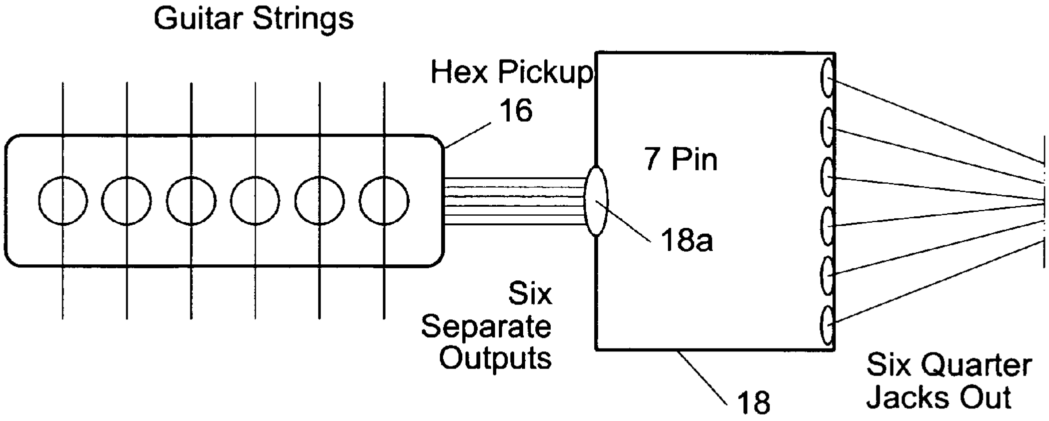
FIG. 1 shows a hexaphonic guitar pickup with six seperate outputs, routed to a seven pin cable which connects to a six way splitter box with six quarter jacks out.
Figure 2:
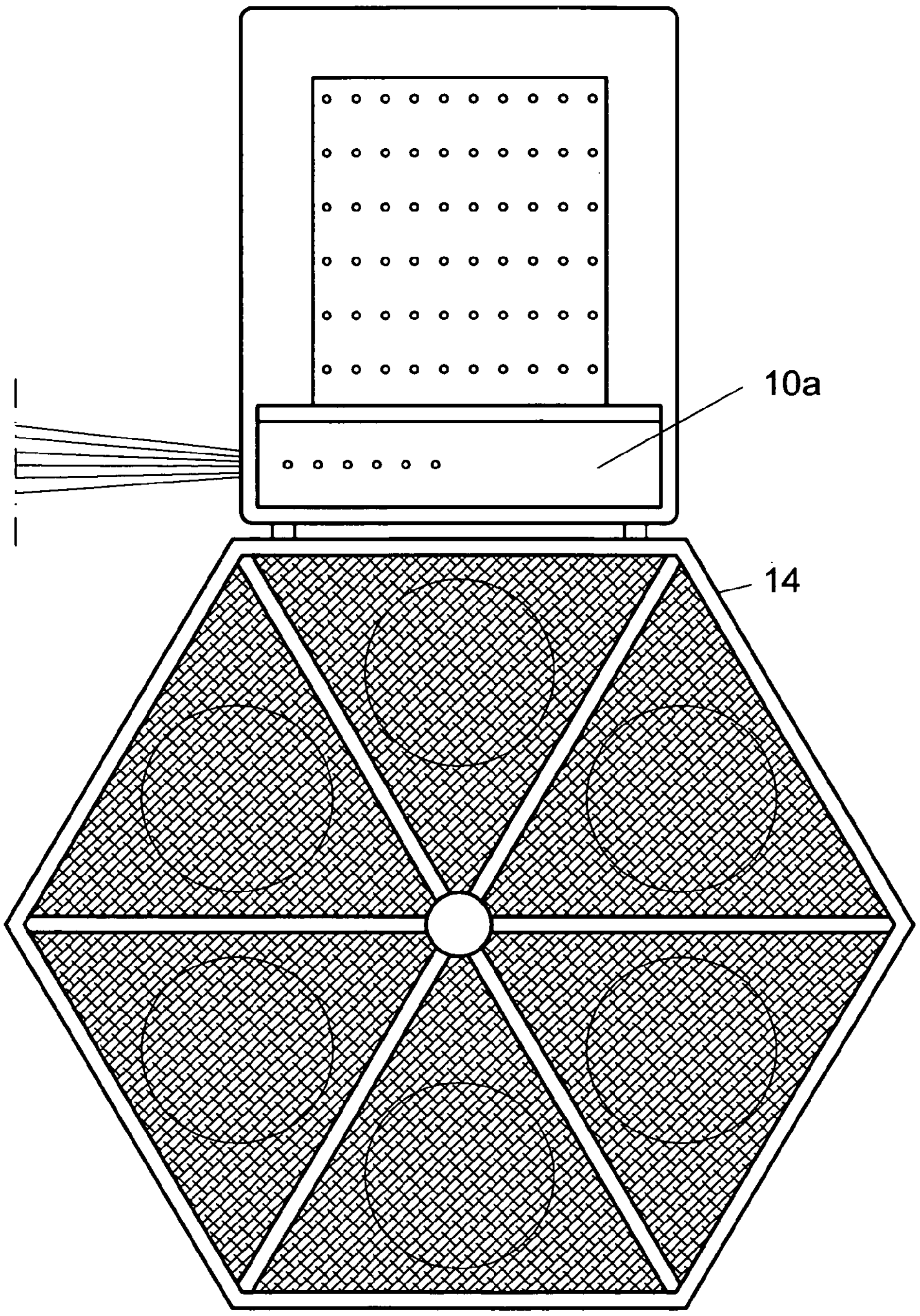
FIG. 2 shows a front view of a hexaphonic guitar amplifier and a hexaphonic speaker cabinet, a six channel preamp, six guitar amps and a hexagon cabinet which accommodates six individual speakers. Each of the speakers are mounted to their own floating baffle boards which will communicate at the six points of the hexagon.

FIGS. 1 and 2

Preferred Embodiment

Figure 3:
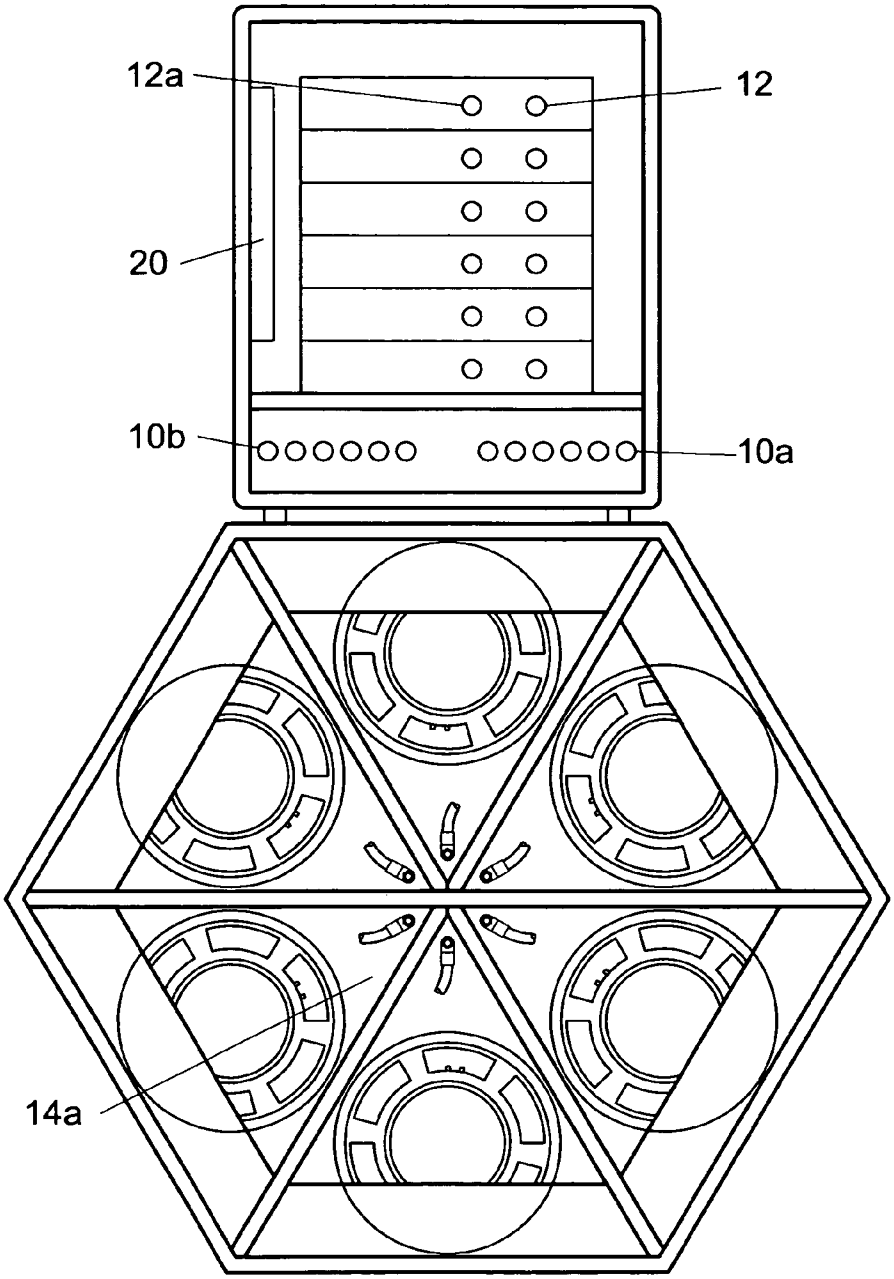
FIG. 3 shows a rear view of a hexaphonic guitar amplifier and a hexaphonic speaker cabinet, with a six channel preamp, six guitar amplifiers, a hexagon cabinet which accommodates six individual speakers which are mounted to their own floating baffle boards which will communicate at the six points of the hexagon.

A preferred embodiment of the present invention is illustrated in FIG. 2 (front view) and FIG. 3 (rear view). A hexagon speaker cabinet houses six speakers (14). The speakers mount to six triangular shaped floating baffle boards (14*a*). The six guitar amp outputs (12*a*) connect to the six speakers with six conventional speaker cables (not shown). A guitar with a hexaphonic pickup (16) connects to a six way splitter box (18) through a seven pin cable (18*b*). This in turn, connects into the inputs of the six channel hex preamp (10*a*) using conventional patch cords (not shown). The hex preamp connects to the six inputs of the guitar amps (12). The six guitar amps and the six channel preamp are powered by a seven cord power strip (20).

Operation

FIGS. 1 and 2

A guitar with a hexaphonic pickup (16) is connected to a six way splitter box (18) through a seven pin cable (18*b*), which then feeds into the inputs of the six channel preamp (10*a*) to boost the weak signal inherent in hexaphonic guitar pickup. The six channel hex preamp outputs (10*b*) feed into six guitar amplifiers inputs (12) the six guitar amplifier outputs feed into six individual speakers. The speakers are mounted to six floating baffle boards (14*a*) which vibrate independently within the hexagon cabinet, resulting in each guitar string having it's own independent channel and speaker creating a novel composite guitar sound in hexaphonic.

CONCLUSIONS, RAMIFICATIONS, AND SCOPE

Accordingly, the reader will see that the hexaphonic guitar amplifier and hexaphonic speaker cabinet of this invention can be used to create novel, majestic, orchestral guitar sounds not possible with conventional guitar amplifiers. In addition, the polyphonic guitar distortion produced by this invention is more natural sounding than that of the hexaphonic fuzz circuits built into guitar synthesizers. This is possible because there are six actual amplifiers and speakers dedicated to processing each of the six guitar strings independently, as opposed to the hexaphonic fuzz circuit in guitar synthesizers, which only reproduce the hexaphonic signal through conventional means such as mono or stereo amplification. Furthermore, this invention bridges the gap between guitar amplifiers and guitar synthesizers in that it gives the electric guitar the orchestral capabilities associated with synthesizers while maintaining the natural tone associated with guitar amplifiers. This is but one embodiment of the invention I have provided. While the above description contains many specificities, these should not be construed as limitations on the scope of any embodiment, but as exemplifications of the presently preferred embodiment thereof. Many other ramifications and variations are possible within the teachings of the various embodiment. For example, the hexagon speaker cabinet can be used for any type of amplification such as musical instruments, sound reinforcement or audio.

I claim:

1. (a) A means for amplifying a guitar hexaphonically (b) an amplifying means wherein said guitar's six strings will be amplified independently of each other resulting in orchestral guitar sounds (c) an amplifying means, comprising:

a) six channels of amplification for processing six guitar strings independently b) six speakers to which said six channels are routed c) a frontal faced hexagon shaped cabinet for housing said six speakers d) six floating baffle boards to which said six speakers are mounted will communicate at the six points of said cabinet and will vibrate individually resulting in independent amplification for each guitar string, whereby hexaphonic guitar sound is produced.

* * * * *